United States Patent
Yang

(10) Patent No.: US 12,000,890 B2
(45) Date of Patent: Jun. 4, 2024

(54) ELECTRONIC DEVICE AND PHASE DETECTOR

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 120 days.

(21) Appl. No.: 17/881,811

(22) Filed: Aug. 5, 2022

(65) Prior Publication Data

US 2024/0044976 A1  Feb. 8, 2024

(51) Int. Cl.
G01R 31/26 (2020.01)
G01R 31/317 (2006.01)
H03K 17/687 (2006.01)

(52) U.S. Cl.
CPC ... G01R 31/31727 (2013.01); H03K 17/6871 (2013.01)

(58) Field of Classification Search
CPC .............. G01R 31/31727; G01R 25/00; G01R 25/005; G01R 25/02; G01R 25/04; G01R 25/06; G01R 25/08; H03K 17/6871; H03L 7/085
See application file for complete search history.

(56) References Cited

U.S. PATENT DOCUMENTS

| | | | | |
|---|---|---|---|---|
| 5,252,865 A | * | 10/1993 | Davenport | H03D 13/003 326/52 |
| 6,340,900 B1 | * | 1/2002 | Donnelly | H03L 7/085 327/7 |
| 7,103,131 B1 | * | 9/2006 | Byran | H03L 7/091 375/375 |
| 9,466,394 B1 | * | 10/2016 | Pelley | G11C 29/028 |
| 9,613,692 B1 | * | 4/2017 | Pasotti | G11C 13/0026 |
| 2003/0016057 A1 | | 1/2003 | Donnelly et al. | |
| 2019/0081604 A1 | | 3/2019 | Thiagarajan et al. | |
| 2019/0393864 A1 | | 12/2019 | Kim | |
| 2022/0182264 A1 | | 6/2022 | Yang et al. | |

FOREIGN PATENT DOCUMENTS

| | | |
|---|---|---|
| CN | 101432967 A | 5/2009 |
| KR | 100216260 B1 | 1/1999 |
| TW | 202201933 A | 1/2022 |

OTHER PUBLICATIONS

Office Action and and the search report mailed on Dec. 28, 2023 related to Taiwanese Application No. 112105350.
Office Action and and the search report mailed on Feb. 28, 2024 related to U.S. Appl. No. 18/208,480.

* cited by examiner

*Primary Examiner* — Thang X Le
(74) *Attorney, Agent, or Firm* — Xuan Zhang

(57) ABSTRACT

An electronic device including a phase detector is provided. The phase detector includes a first transistor, a second transistor, a third transistor, a fourth transistor, and a first equalizer device. The first transistor has a first input terminal configured to receive a first signal. The second transistor has a second input terminal configured to receive a second signal. The third transistor is electrically connected to the first transistor and has a first output terminal. The fourth transistor is electrically connected to the second transistor and has a second output terminal. The first equalizer device is connected between the first output terminal and the second input terminal.

13 Claims, 12 Drawing Sheets

ELECTRONIC DEVICE AND PHASE DETECTOR

TECHNICAL FIELD

The present disclosure relates to an electronic device, and more particularly, to an electronic device including a phase detector.

DISCUSSION OF THE BACKGROUND

An electronic device may be configured to output a plurality of clocks for various parts of an integrated circuit based on a reference clock. The electronic device may include a phase detector for controlling the phase of the output clocks. However, any imbalance in the phase detector can affect function.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a phase detector including a first transistor, a second transistor, a third transistor, a fourth transistor, and a first equalizer device. The first transistor has a first input terminal configured to receive a first signal. The second transistor has a second input terminal configured to receive a second signal. The third transistor is electrically connected to the first transistor and has a first output terminal. The fourth transistor is electrically connected to the second transistor and has a second output terminal. The first equalizer device is connected between the first output terminal and the second input terminal.

Another aspect of the present disclosure provides a phase detector including a first output terminal, a second output terminal, a first p-type transistor, a second p-type transistor, a first equalizer device, and a second equalizer device. An output signal at the second output terminal is complementary to that of the first output terminal. The first p-type transistor has a gate electrically connected to the second output terminal, source electrically connected to a supply voltage, and a drain electrically connected to the first output terminal. The second p-type transistor has a gate electrically connected to the first output terminal, a source electrically connected to the supply voltage, and a drain electrically connected to the second output terminal. The first equalizer device is connected between the first output terminal and the second input terminal. The second equalizer device is connected between the gate of the first p-type transistor and the gate of the second p-type transistor.

Another aspect of the present disclosure provides an electronic device including a receiver, a delay line, a data output port, and a phase detector. The receiver is configured to receive a reference clock signal and generate a first signal. The delay line is electrically connected to the receiver and configured to adjust a phase of the first signal to generate a second signal. The data output port is electrically connected to the delay line and provides a feedback signal associated with the second signal. The phase detector is electrically connected to the data output port and the delay line. The phase detector includes a first transistor, a second transistor, a third transistor, a fourth transistor, and a first equalizer device. The first transistor has a first input terminal configured to receive a first signal. The second transistor has a second input terminal configured to receive a second signal. The third transistor is electrically connected to the first transistor and has a first output terminal. The fourth transistor is electrically connected to the second transistor and has a second output terminal. The first equalizer device is connected between the first output terminal and the second input terminal.

In some embodiments, the fourth equalizer is configured to: during an equalization period, be turned on to equalize voltages at the drain of the first transistor and the drain of the second transistor; and during a sensing period, be turned off to electrically disconnect the drain of the first transistor and the drain of the second transistor.

In some embodiments, the phase detector further comprises: a seventh transistor having a gate configured to receive the first signal, a source electrically connected to a supply voltage, and a drain electrically connected to the first output terminal; and an eighth transistor having a gate configured to receive the first signal, a source electrically connected to the supply voltage, and a drain electrically connected to the second output terminal.

In some embodiments, the seventh transistor and the eighth transistor are turned on to electrically connect the first output terminal and the second output terminal to the supply voltage during an equalization period.

In some embodiments, the phase detector further comprises: a ninth transistor having a gate configured to receive the first signal, a source electrically connected to the supply voltage, and a drain electrically connected a drain of the first transistor; and a tenth transistor having a gate configured to receive the first signal, a source electrically connected to the supply voltage, and a drain electrically connected to a drain of the second transistor.

In some embodiments, the ninth transistor and the tenth transistor are turned on to electrically connect the drain of the first transistor and the drain of the second transistor to the supply voltage during the equalization period.

In some embodiments, the first equalizer is configured to, during an equalization period, be turned on to equalize voltages at the first output terminal and the second input terminal, and the second equalizer is configured to, during an equalization period, be turned on to equalize voltages at the gate of the first p-type transistor and the gate of the second p-type transistor.

In some embodiments, the phase detector further comprises: a first n-type transistor having a gate electrically connected to the second output terminal, a source electrically connected to a ground, and a drain electrically connected to the first output terminal; a second n-type transistor having a gate electrically connected to the first output terminal, a source electrically connected to the ground and a drain electrically connected to the second output terminal; and a third equalizer device connected between the gate of the first n-type transistor and the gate of the second n-type transistor.

In some embodiments, the first equalizer device, the second equalizer, and the third equalizer are electrically connected in parallel but are in different layout locations.

In some embodiments, the phase detector further comprises: a third n-type transistor having a gate configured to receive a first signal, a source electrically connected to a ground, and a drain electrically connected to the source of the first n-type transistor; a fourth n-type transistor having a gate configured to receive a second signal, a source electrically connected to the ground, and a drain electrically connected to the source of the second n-type transistor; and a fourth equalizer device connected between the drain of the third n-type transistor and the drain of the fourth n-type transistor.

In some embodiments, the phase detector further comprises: a fifth equalizer device is configured to electrically connect the first output terminal to the supply voltage during the equalization period; and a sixth equalizer device is configured to electrically connect the second output terminal to the supply voltage during the equalization period.

In some embodiments, the phase detector further comprises: a seventh equalizer device is configured to electrically connect the drain of the third n-type transistor to the supply voltage during the equalization period; and an eighth equalizer device is configured to electrically connect the drain of the fourth n-type transistor to the supply voltage during the equalization period.

In some embodiments, the first equalizer is configured to: during an equalization period, be turned on to equalize voltages at the first output terminal and the second output terminal; and during a sensing period, be turned off to electrically disconnect the first output terminal and the second output terminal.

In some embodiments, the feedback signal and the reference signal have a same frequency, and wherein the feedback signal has a first phase and the reference signal has a second phase.

In some embodiments, during the sensing period, the phase detector is configured to determine whether the first phase of the first signal is ahead of or later than the second phase of the first signal.

In some embodiments, if the first phase is ahead of the second phase, the phase detector is configured to control the delay line to increase the delay of the first phase of the first signal.

In some embodiments, if the first phase is later than the second phase, the phase detector is configured to control the delay line to decrease the delay of the first phase of the first signal.

The phase detector of the present disclosure includes a first transistor having a first input terminal configured to receive a first signal, a second transistor having a second input terminal configured to receive a second signal, a third transistor electrically connected to the first transistor and having a first output terminal, and a fourth transistor electrically connected to the second transistor and having a second output terminal. The phase detector further includes a first equalizer device connected between the first output terminal and the second input terminal. The first equalizer device is configured to turn on to equalize voltages at the first output terminal and the second output terminal during an equalization period. The voltages at the first and second output terminals are equalized before the phase detector is operated during a sensing period. As such, the imbalance between the first and second output terminals can be alleviated. Furthermore, the phase detector may include a plurality of equalizer devices electrically connected in parallel but in different layout locations. One of the equalizer devices (e.g., the first equalizer device) is located adjacent to the first output terminal and the second output terminal. Another of the equalizers may be located adjacent to a gate of the third transistor and a gate of the fourth transistor. Yet another of the equalizer devices may be adjacent to a gate of a first pull-up transistor and a gate of a second pull-up transistor. The localization of the equalizer devices enables equalization in a specific layout location, such that the impact of different loadings induced by local parasitic capacitors or resistors can be reduced. The equalizer devices may include an n-type transistor and a p-type transistor electrically connected in parallel. During the equalization period, the n-type transistor and p-type transistor are turned on to equalize voltages at different two nodes. The pair of the p-type transistor and the n-type transistor has a higher conductive current than, for example, a single p-type transistor. As such, the time for discharging or charging the local capacitors can be relatively short and equalization thus faster.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
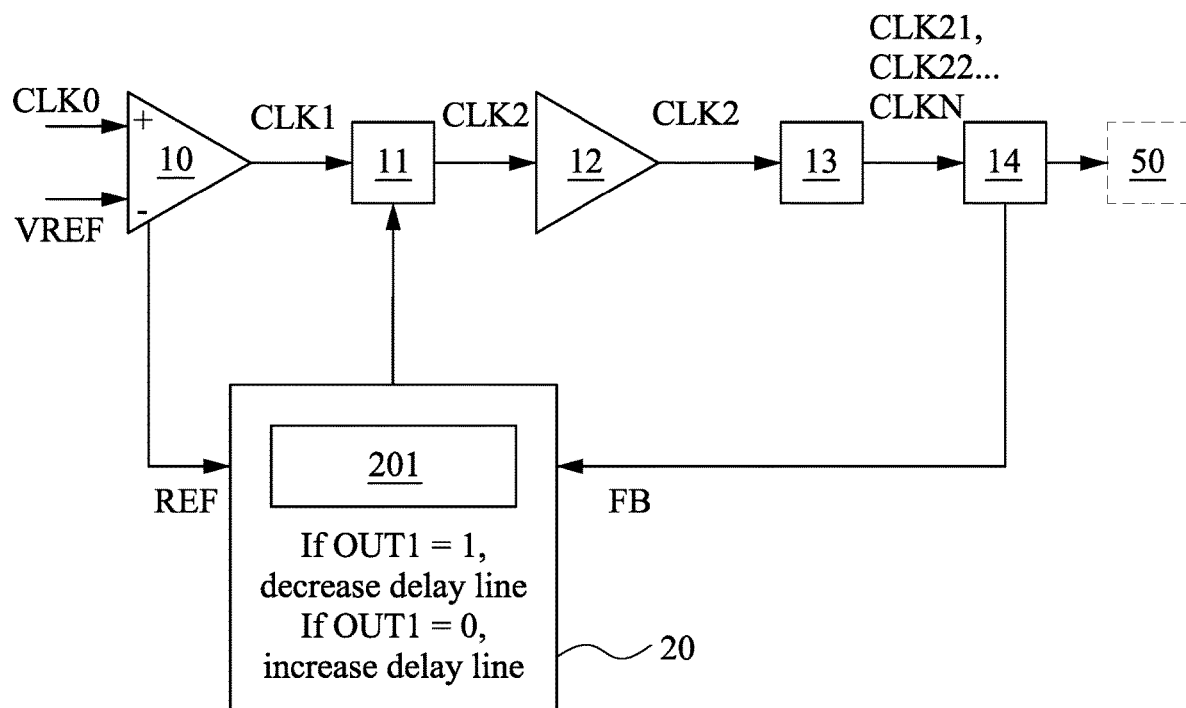
FIG. 1 is a block diagram of an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of an electronic device 100 in accordance with some embodiments of the present disclosure. The electronic device 100 includes a reference clock receiver 10, a delay line 11, an amplifier 12, a clock tree 13, a data output port 14, and a phase detector 20. The reference clock receiver 10 is electrically connected to the delay line 11. The delay line 11 is electrically connected to the clock tree 13. The clock tree 13 is electrically connected to the data output port 14. The data output port 14 is electrically connected to the phase detector 20. The phase detector 20 is electrically connected to the delay line 11.

The electronic device 100 may be a delay-locked loop (DLL) configured to provide one or more clock signals to an integrated circuit 50. The integrated circuit 50 is denoted by a dashed line, indicating that the electronic device 100 may not include the integrated circuit 50. In alternative embodiments, the integrated circuit 50 and the electronic device 100 may be integrated into a system and communicate via wirings or buses.

The reference clock receiver 10 is configured to receive a reference clock signal CLK0 and a reference voltage signal VREF. The reference clock receiver 10 acts as a buffer of the electronic device 100 to receive the reference clock signal CLK0. The reference clock receiver 10 may include a differential amplifier. The reference clock receiver 10 is configured to generate a clock signal CLK1 in response to the reference clock CLK0. The clock signal CLK1 may have a phase later than a phase of the reference clock signal CLK0 owing to delay caused by the reference clock receiver 10.

The delay line 11 is configured to receive the clock signal CLK1. The delay line 11 may be configured to adjust the phase of the clock signal CLK1. In some embodiments, the delay line 11 may include a plurality of delay cells connected in series. The delay line 11 may be configured to adjust the phase of the clock signal CLK1 by controlling the number of delay cells that the clock signal CLK1 passes. The more delay cells that the clock signal CLK1 passes, the more delayed the phase of the clock signal CLK1 will be, and vice versa. The delay cells of the delay line 11 may include buffers. The delay line 11 is configured to generate a clock signal CLK2 in response to the clock signal CLK1 and the control signal from the phase detector 20, which is discussed in detail later.

The amplifier 12 is configured to receive the clock signal CLK2. The amplifier is configured to boost the clock signal CLK2, such that the clock signal CLK2 has sufficient signal strength for the next stage (e.g., the clock tree 13).

The clock tree 13 is configured to receive the clock signal CLK2. The clock tree 13 is configured to distribute a global clock signal (e.g., the clock signal CLK2) to various parts of the integrated circuit 50. The clock tree 13 may include multistage repeat buffers to distribute the clock signal CLK2 and isolate the loading of each part of the integrated circuit 50 from a source (e.g., the clock signal CLK2). In some embodiments, the clock tree 13 may produce one or more clock signals CLK21, CLK22 . . . CLK2N to the data output port 14 based on the clock signal CLK2, wherein N is a positive integer.

The data output port 14 is configured to receive the one or more clock signals CLK21, CLK22 . . . CLK2N. The data output port 14 may include a plurality of pins electrically connected to various parts of the integrated circuit 50. The data output port 14 may be configured to transmit the one or more clock signals CLK21, CLK22 . . . CLK2N to the various parts of the integrated circuit 50 through the plurality of pins. The data output port 14 may be configured to provide one of the one or more clock signals CLK21, CLK22 . . . CLK2N as a feedback signal FB to the phase detector 20. The feedback signal FB may be associated with the clock signal CLK2.

The phase detector 20 is configured to receive a feedback signal (or a first signal) FB from the data output port 14. The phase detector 20 is configured to receive a reference signal (or a second signal) REF from the reference clock receiver 20. The reference signal REF may be associated with the reference clock signal CLK0. The frequency of feedback signal FB and that of the reference signal REF may be the same. The phase detector 20 may include a delay line controller 201. In alternative embodiments, the delay line controller 201 may be separated from the phase detector 20.

The phase detector 20 is configured to determine whether a phase of the feedback signal FB is ahead of or later than a phase of the reference signal REF. The phase detector 20 is configured to compare the phase of the feedback signal FB and the phase of the reference signal REF. If it is determined that the phase of the feedback signal FB is ahead of the phase of the reference signal REF, the phase detector 20 produces an output signal OUT1 with a first value (e.g., logic low value, "0") to the delay line 11. In response to the output signal OUT1, the delay line controller 201 is configured to control the delay line 11 to increase the delay of the phase of the clock signal CLK2. In some embodiments, the delay line controller 201 is configured to increase the delay cells (of the delay line 11) that the clock signal CLK1 passes before being output as the clock signal CLK2.

If it is determined that the phase of the feedback signal FB is later than the phase of the reference signal REF, the phase detector 20 produces the output signal OUT1 with a second value (e.g., logic high value, "1") to the delay line 11. In response to the output signal OUT1, the delay line controller 201 is configured to control the delay line 11 to decrease the delay of the phase of the clock signal CLK2. In some embodiments, the delay line controller 201 is configured to decrease the delay cells (of the delay line 11) that the clock signal CLK1 passes before being output as the clock signal CLK2.

If the phase of the feedback signal FB and the phase of the reference signal REF are the same, the delay line controller 201 is configured to control the delay line to retain the delay of the phase of the clock signal CLK2.

In some embodiments, the delay line controller 201 may include a shift register, a counter, a successive approximation register (SAR) counter, or the like.

In some embodiments, the electronic device 100 may further include a low-pass filter (not shown) between the phase detector 14 and the delay line 11 to screen out noise at high frequencies.

Figure 2:
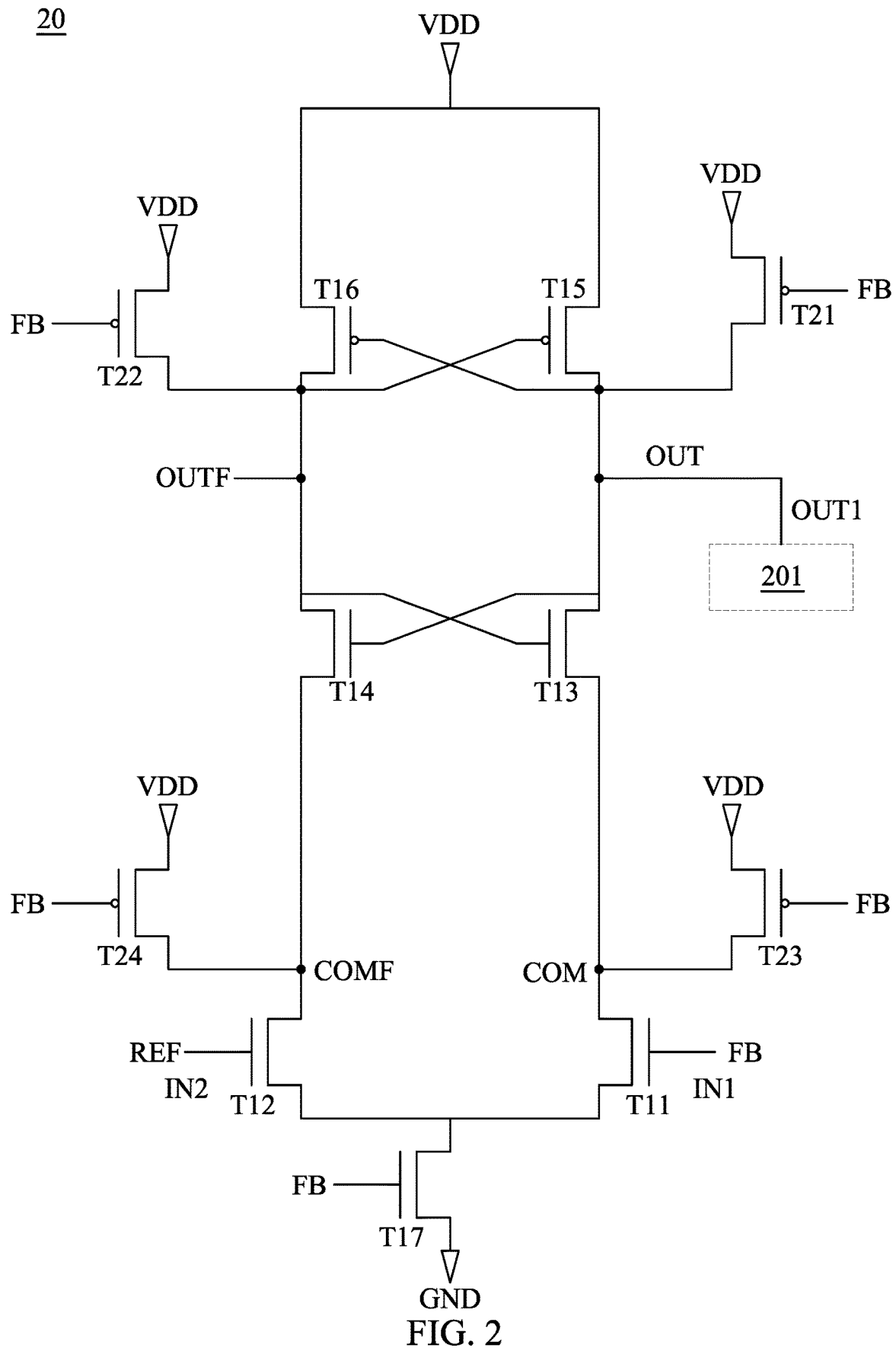
FIG. 2 is a schematic diagram of a phase detector in accordance with some embodiments of the present disclosure.

FIG. 2 is a schematic diagram of the phase detector 20 in accordance with some embodiments of the present disclosure. The phase detector 20 includes transistors T11, T12, T13, T14, T15, T16, T17, T21, T22, T23, and T24. The transistors T11, T12, T13, T14, T15, T16, T17, T21, T22, T23, and T24 may each include a MOS field-effect transistor (FET). The transistors T11, T12, T13, T14, T15, T16, T17, T21, T22, T23, and T24 may each include a p-type MOSFET or an n-type MOSFET. The exemplary transistor as shown in FIG. 2 for the transistor T11, T12, T13, T14, or T17 will be an n-type MOSFET. The exemplary transistor as shown in FIG. 2 for the transistor T15, T16, T21, T22, T23, or T24 will be a p-type MOSFET.

The transistor T11 has a gate as a first input terminal IN1 configured to receive the feedback signal (or a first signal) FB. The transistor T11 has a source electrically connected to a ground GND through the transistor T17. The transistor T11 has a drain electrically connected to a source of the transistor T13. The drain of the transistor T11 may be electrically connected to a drain of the transistor T23. The node to which the drain of the transistor T11, the source of the transistor T13, and the source of the transistor T23 are connected is referred to as a first comparison node COM.

The transistor T12 has a gate as a second input terminal IN2 configured to receive the reference signal (or a second signal) REF. The transistor T12 has a source electrically connected to the ground GND through the transistor T17. The transistor T12 has a drain electrically connected to a source of the transistor T14. The drain of the transistor T12 may be electrically connected to a drain of the transistor T24. The node to which the drain of the transistor T12, the source of the transistor T14, and the source of the transistor T24 are connected is referred to as a second comparison node COMF.

The transistor T17 has a gate configured to receive the feedback signal FB, a drain electrically connected to the source of the transistor T11 and the source of the transistor T12, and a source electrically connected to the ground GND. The transistor T17 may be configured as a current source.

The transistor T13 has a gate electrically connected to a gate of the transistor T15, the source electrically connected to the drain of the transistor T11, and a drain as a first output terminal OUT of the phase detector 20. The transistor T14 has a gate electrically connected to a gate of the transistor T16, the source electrically connected to the drain of the transistor T12, and a drain as a second output terminal OUTF of the phase detector 20. The gate of the transistor T13 is electrically connected to the second output terminal OUTF. The gate of the transistor T14 is electrically connected to the first output terminal OUT.

The transistor T15 has a gate electrically connected to the second output terminal OUTF, a drain electrically connected to the first output terminal OUT, and a source electrically connected to a supply voltage VDD. The transistor T16 has a gate electrically connected to the first output terminal OUT, a drain electrically connected to the second output terminal OUTF, and a source electrically connected to the supply voltage VDD.

The transistor T21 has a gate configured to receive the feedback signal FB, a source electrically connected to the supply voltage VDD, and a drain electrically connected to the first output terminal OUT. The transistor T24 has a gate configured to receive the feedback signal FB, a source electrically connected to the supply voltage VDD, and a drain electrically connected to the second output terminal OUTF.

The transistor T23 has a gate configured to receive the feedback signal FB, a source electrically connected to the supply voltage VDD, and a drain electrically connected to the first comparison node COM (or the drain of the transistor T11). The transistor T22 has a gate configured to receive the feedback signal FB, a source electrically connected to the supply voltage VDD, and a drain electrically connected to the second comparison node COMF (or the drain of the transistor T12).

Figure 3:
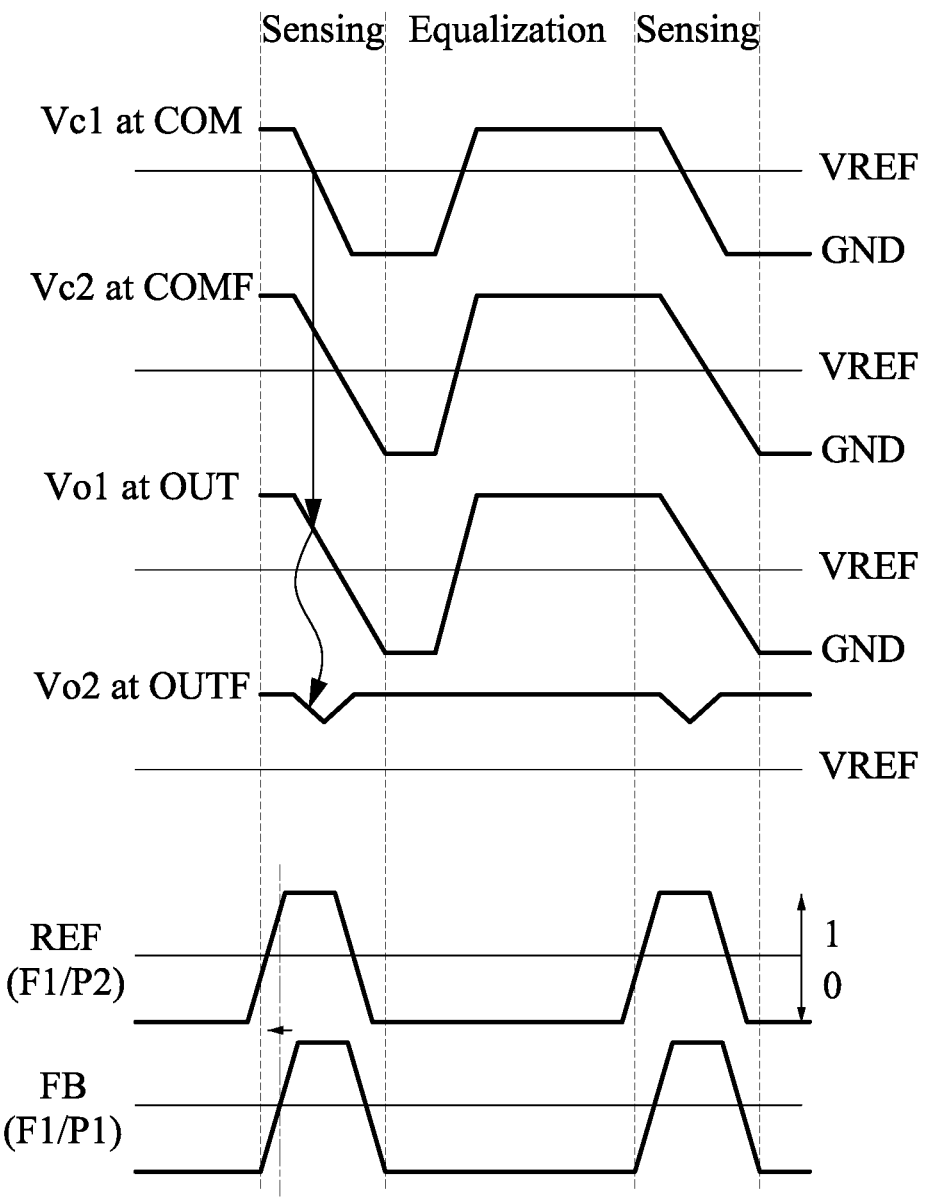
FIG. 3 is a timing diagram for operation of a phase detector in accordance with some embodiments of the present disclosure.

FIG. 3 is a timing diagram for operation of the phase detector 20 in accordance with some embodiments of the present disclosure. As shown in FIG. 3, the operation of the phase detector 20 includes interleaved sensing and equalization periods. One equalization period may be followed by one sensing period. In some embodiments, the phase detector is under the sensing period when the feedback signal FB is rising, logic high (or has a logic high value, "1"), falling. The phase detector is under the equalization period when the feedback signal FB is logic low (or has a logic low value, "0"). The feedback signal FB and reference signal REF have a same frequency F1.

During the equalization period, the transistor (or p-type transistor) T23 is turned on since the feedback signal FB as received by the gate thereof is logic low value. A voltage Vc1 at the first comparison node COM is subsequently electrically connected to the supply voltage VDD through the transistor T23. However, owing to the voltage division induced by the parasitic capacitance and resistance at the first comparison node COM, the voltage Vc1 at the first comparison node COM will not be pulled up to the supply voltage VDD. In other words, the voltage Vc1 may be lower than the supply voltage VDD.

During the equalization period, the transistor (or p-type transistor) T24 is turned on since the feedback signal FB as received by the gate thereof is logic low value. A voltage Vc2 at the second comparison node COM is subsequently electrically connected to the supply voltage VDD through the transistor T24. The transistors T23 and T24 may be referred to as equalizer devices since they are used to electrically connect the comparing nodes COM and COMF to the supply voltage. However, owing to the voltage division induced by the parasitic capacitance and resistance at the second comparison node COMF, the voltage Vc2 at the second comparison node COMF will not be pulled up to the supply voltage VDD. In other words, the voltage Vc2 may be lower than the supply voltage VDD.

As discussed, the voltage Vc1 at the first comparison node COM and the voltage Vc2 at the second comparison node COMF are different from the supply voltage VDD. Furthermore, the voltage division induced by the parasitic capacitance and resistance at the first comparison node COM and the second comparison node COMF may be different. The voltage Vc1 and the voltage Vc2 may be different. In FIG. 3, the voltage Vc1 is lower than the voltage Vc2.

In some embodiments, the loading of the circuit (e.g., the reference clock receiver 10) that transmits the reference signal REF may influence the voltage Vc1 and the loading of the circuit (e.g., the data output port 14) that transmits the feedback signal FB may influence the voltage Vc2. Owing to the different structures of the reference clock receiver 10 and the data output port 14, the loadings thereof are different. As such, the voltage Vc1 and the voltage Vc2 may be influenced by different extents, causing a severe imbalance between the first comparison node COM and the second comparison node COMF.

During the equalization period, the transistor (or p-type transistor) T21 is turned on since the feedback signal FB as received by the gate thereof is logic low value. A voltage Vo1 at the first output terminal OUT is subsequently electrically connected to the supply voltage VDD through the transistor T21. However, owing to the voltage division induced by the parasitic capacitance and resistance at the first output terminal OUT, the voltage Vo1 at the first output terminal OUT would not be pulled up to the supply voltage VDD. In other words, the voltage Vo1 is lower than the supply voltage VDD.

During the equalization period, the transistor (or p-type transistor) T22 is turned on since the feedback signal FB as received by the gate thereof is logic low value. A voltage Vo2 at the second output terminal OUTF is subsequently electrically connected to the supply voltage VDD through the transistor T22. The transistors T21 and T22 may be referred to equalizer devices since they are used to electrically connect the output terminals OUT and OUTF to the supply voltage. However, owing to the voltage division induced by the parasitic capacitance and resistance at the second output terminal OUTF, the voltage Vo2 at the second output terminal OUTF would not be pulled up to the supply voltage VDD. In other words, the voltage Vo2 is lower than the supply voltage VDD.

As discussed, the voltage Vo1 at the first output terminal OUT and the voltage Vo2 at the second output terminal OUTF are different from the supply voltage VDD. Furthermore, the voltage division induced by the parasitic capacitance and resistance at the first output terminal OUT and the second output terminal OUTF may be different. The voltage Vo1 and the voltage Vo2 may be different. In FIG. 3, the voltage Vo1 is lower than the voltage Vo2.

During the sensing period, the transistors T23 and T24, are turned off, such that the voltages at the first comparison node COM and the second comparison node COMF will change depend on the feedback signal FB and the reference signal REF. During the sensing period, the transistors T21 and T22 are turned off, such that the first output terminal OUT and the second output terminal OUTF will change depend on the feedback signal FB and the reference signal REF. The phase detector 20 is configured to determine whether a phase P1 of the feedback signal FB is ahead of or later than a phase P2 of the reference signal REF. The phase detector 20 is configured to compare the phase P1 of the feedback signal FB and the phase P2 of the reference signal REF.

As shown in FIG. 3, the phase P1 of the feedback signal FB is later than the phase P2 of the reference signal REF. When the feedback signal FB rises and exceeds a threshold voltage of the transistor T11, the transistor T11 is turned on to pull down the voltage Vc1 at the first comparison node COM to the ground GND. When the reference signal REF rises and exceeds a threshold voltage the transistor T12, the transistor T12 is turned on to pull down the voltage Vc2 at the second comparison node COMF to the ground GND.

Owing to the phase differences between the feedback signal FB and the reference signal REF, the voltage Vc2 at the second comparison node COMF starts falling earlier than the voltage Vc1 at the first comparison node COM. However, the voltage Vc1 at the first comparison node COM is lower than the voltage Vc2 at the second comparison node COMF. Even though the phase P2 of reference signal REF is ahead of the phase P1 of the feedback signal FB and the transistor T12 is turned on earlier than the transistor T11, the voltage Vc1 at the first comparison node COM reaches a reference voltage value VREF earlier than the voltage Vc2 at the second comparison node COMF.

At the beginning of the sensing period, the voltage Vo1 at the first output terminal OUT falls with the voltage Vc1 at the first comparison node COM. In the meantime, the voltage Vo2 at the second output terminal OUTF falls with the voltage Vc2 at the second comparison node COMF. When the voltage Vc1 at the first comparison node COM reaches the reference voltage value VREF, the transistor T13 turns on and the voltage Vo1 at the first output terminal OUT follows the voltage Vc1 at the first comparison node COM. The voltage Vo1 at the first output terminal OUT reaches the ground level (or is pulled down to the ground GND) through the transistors T11 and T13. Subsequently, the gate of the transistor (or the n-type transistor) T14 receives the voltage Vo1 with the ground level (or logic low value, "0") to turn off the transistor T14. The gate of the transistor (or the p-type transistor) T16 receives the voltage Vo1 with the ground level to turn on the transistor T16. As shown in FIG. 3, the voltage Vo2 at the second output terminal OUTF is electrically connected to the supply voltage through the transistor T16 and reverts to the initial state at the beginning of the sensing period. In some embodiments, an output signal (e.g., the output signal OUT1) at the first output terminal OUT is complementary to that at the second output terminal OUTF in the sensing period.

The phase detector 20 transmits an output signal OUT1 which represents the voltage Vo1 (logic low value, "0") at the first output terminal OUT to the delay line controller 201. In response to the output signal OUT1, the delay line controller 201 is configured to control the delay line 11 to increase the delay of the phase of the clock signal CLK2 in FIG. 1, which is associated with the feedback signal FB. As a result, the phase detector may malfunction whereby the feedback signal FB has an updated phase later than that of the reference signal REF in an even greater extent than the original phase.

Figure 4:
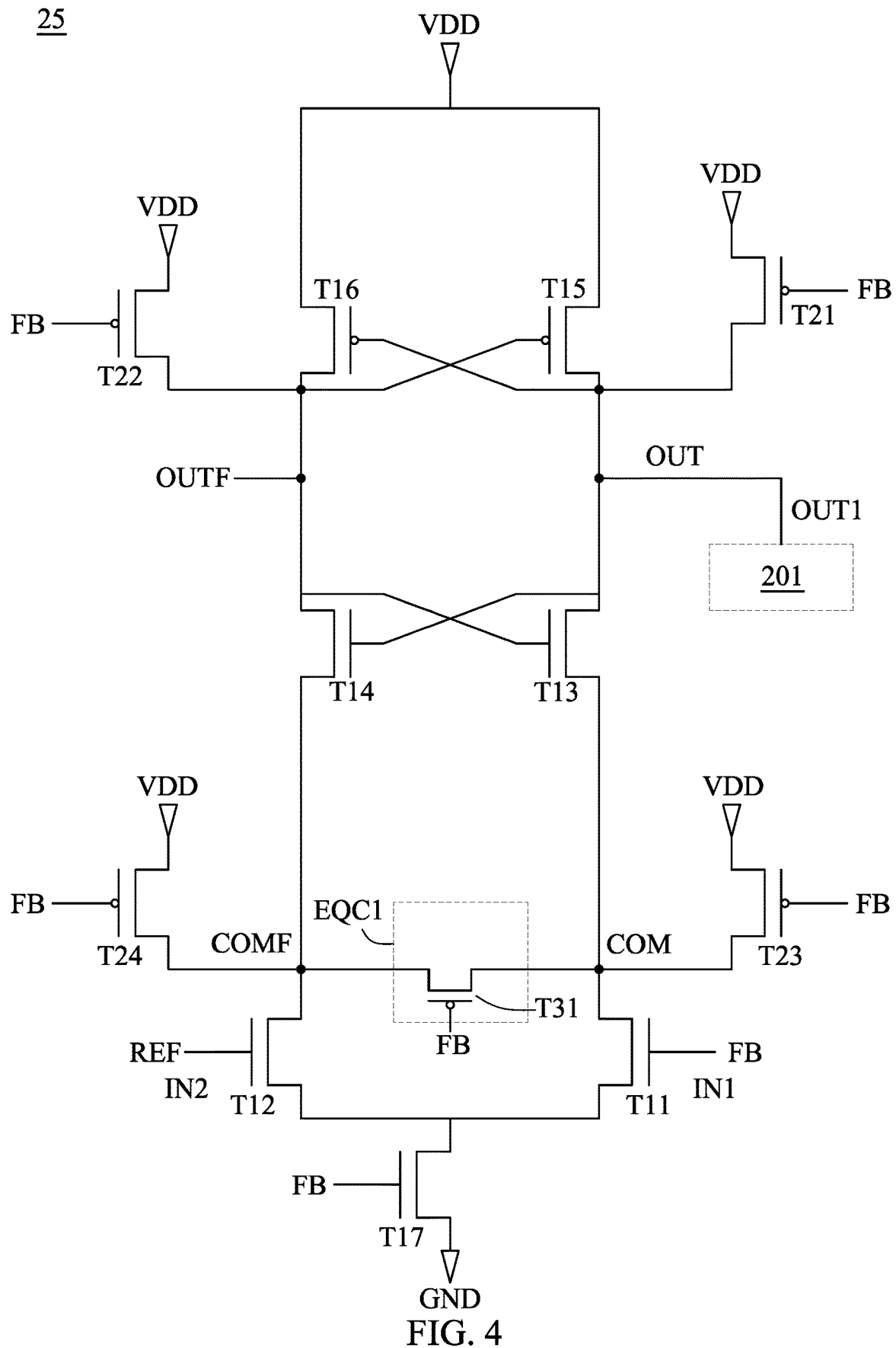
FIG. 4 is a schematic diagram of a phase detector in accordance with some embodiments of the present disclosure.

FIG. 4 is a schematic diagram of a phase detector 25 in accordance with some embodiments of the present disclosure. The characteristics of the elements with the same reference numerals as those in FIG. 2 can be referred to relevant descriptions of FIG. 2. The phase detector 20 of the electronic device 100 of FIG. 1 may be replaced by the phase detector 25 of FIG. 4.

The phase detector 25 includes an equalizer device EQC1 connected between the first comparison node COM (or the drain of the transistor T11) and the second comparison node COMF (or the drain of the transistor T12). The equalizer device EQC1 may include a p-type transistor T31. The p-type transistor T31 has a gate configured to receive the feedback signal FB, a drain electrically connected to the first comparison node COM (or the drain of the transistor T11) and a source electrically connected to the second comparison node COMF (or the drain of the transistor T12). In some embodiments, the drain of the p-type transistor T31 may be electrically connected to the second comparison node COMF and the source of the p-type transistor T31 may be electrically connected to the first comparison node COM. The p-type transistor T31 may be a MOSFET.

Figure 5:
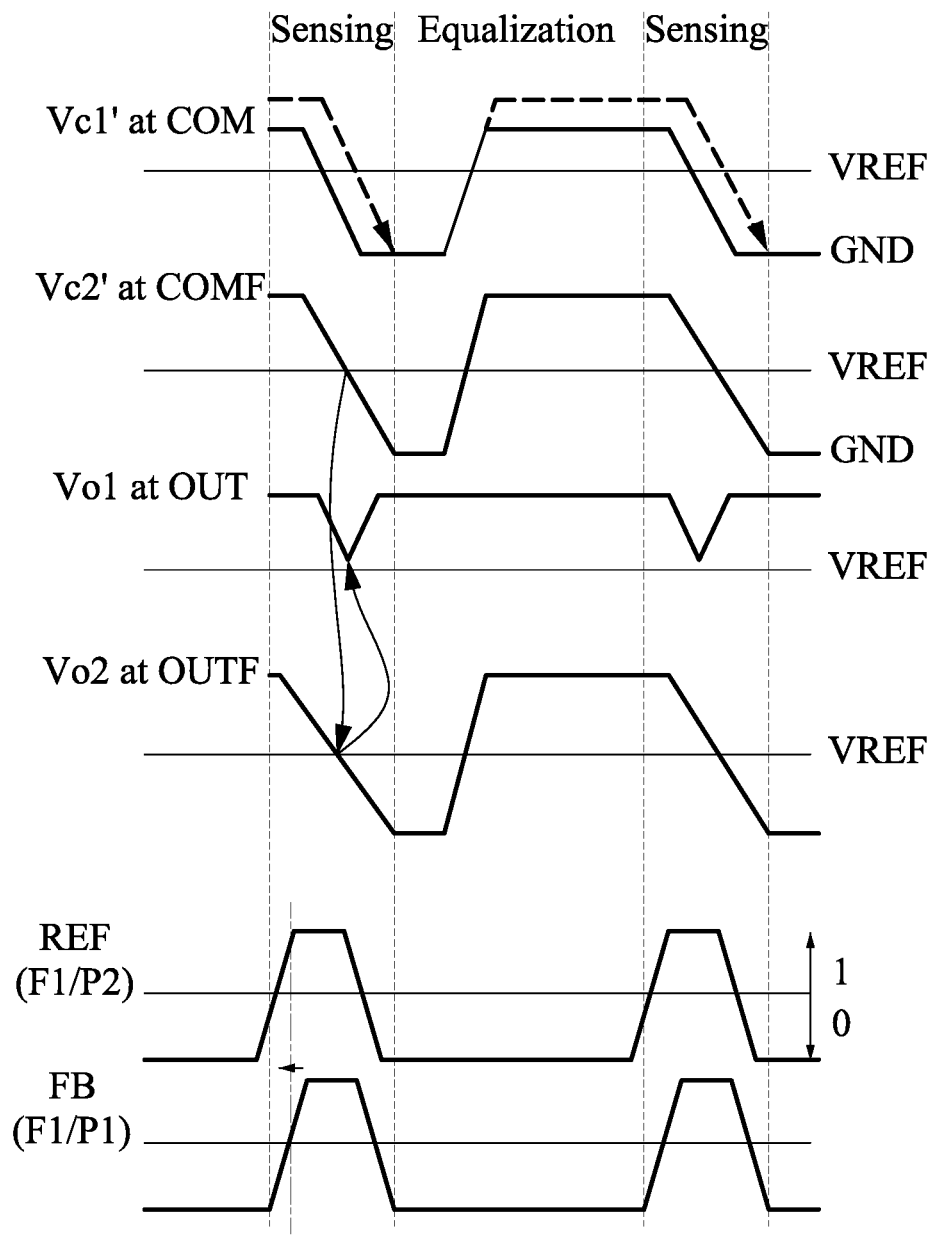
FIG. 5 is a timing diagram for operation of a phase detector in accordance with some embodiments of the present disclosure.

FIG. 5 is a timing diagram for operation of the phase detector 25 in accordance with some embodiments of the present disclosure.

During the equalization period, the equalizer device EQC1 may be configured to equalize a voltage Vc1' at the first comparison node COM and a voltage Vc2' at the second comparison node COMF. In some embodiments, the p-type transistor T31 of the equalizer device EQC1 is turned on since the feedback signal FB as received by the gate thereof is logic low value. The equalizer device EQC1 electrically connects the first comparison node COM and the second comparison node COMF. The voltage Vc1' at the first comparison node COM and the voltage Vc2' at the second comparison node COMF may be equalized, e.g., substantially the same. The solid line in the waveform of the voltage at the first comparison node COM represents the voltage Vc1 and the dashed line in the waveform of the voltage Vc1' the equalized voltage. As shown in FIG. 5. The voltage Vc1' and the voltage Vc2' are at substantially the same level at the beginning of the sensing period. The imbalance between the comparison nodes can be significantly alleviated.

In some embodiments, the voltage Vc1' or the voltage Vc2' may be in a range between the voltage Vc1 and the voltage Vc2.

During the sensing period, in response to the feedback signal FB, the equalizer device EQC1 turns off to electrically disconnect the first comparison node COM (or the drain of the transistor T11) and the second comparison node COW (or the drain of the transistor T12).

As shown in FIG. 5, the phase P1 of the feedback signal FB is later than that of the reference signal REF, which is similar to FIG. 3. The voltage Vc2' at the second comparison node COW starts falling earlier than the voltage Vc1' at the first comparison node COM. Unlike in FIG. 3, the voltage Vc2' at the second comparison node COMF reaches the reference voltage value VREF earlier than the voltage Vc1' at the first comparison node COM.

At the beginning of the sensing period, the voltage Vo1 at the first output terminal OUT falls with the voltage Vc1' at the first comparison node COM. In the meantime, the voltage Vo2 at the second output terminal OUTF falls with the voltage Vc2' at the second comparison node COMF. When the voltage Vc2' at the second comparison node COMF reaches the reference voltage value VREF, the transistor T14 turns on and the voltage Vo2 at the second output terminal OUTF follows the voltage Vc2' at the first comparison node COM. The voltage Vo2 at the second output terminal OUTF reaches the ground level (or is pulled down to the ground GND) through the transistors T12 and T14. Subsequently, the gate of the transistor (or the n-type transistor) T13 receives the voltage Vo2 with the ground level (or logic low value, "0") to turn off the transistor T13. The gate of the transistor (or the p-type transistor) T15 receives the voltage Vo2 with the ground level to turn on the transistor T15. As shown in FIG. 5, the voltage Vo1 at the first output terminal OUT is electrically connected to the supply voltage VDD through the transistor T15 and reverts to the initial state at the beginning of the sensing period.

The phase detector 20 transmits the output signal OUT1 which represents the voltage Vo1 (logic high value, "1") at the first output terminal OUT to the delay line controller 201. In response to the output signal OUT1, the delay line controller 201 is configured to control the delay line 11 to decrease the delay of the phase of the clock signal CLK2 in FIG. 1, which is associated with the feedback signal FB. Furthermore, the delay line controller 201 may be configured to calculate the difference between the phase P1 of the feedback signal FB and the phase P2 of the reference signal REF. As a result, the phase detector 25 functions correctly and the difference between the phases of the feedback signal FB and the reference signal REF is reduced. During a plurality of cycles of the sensing period and the equalization period, the feedback signal FB and the reference signal REF may be synchronized or nearly synchronized.

Figure 6:
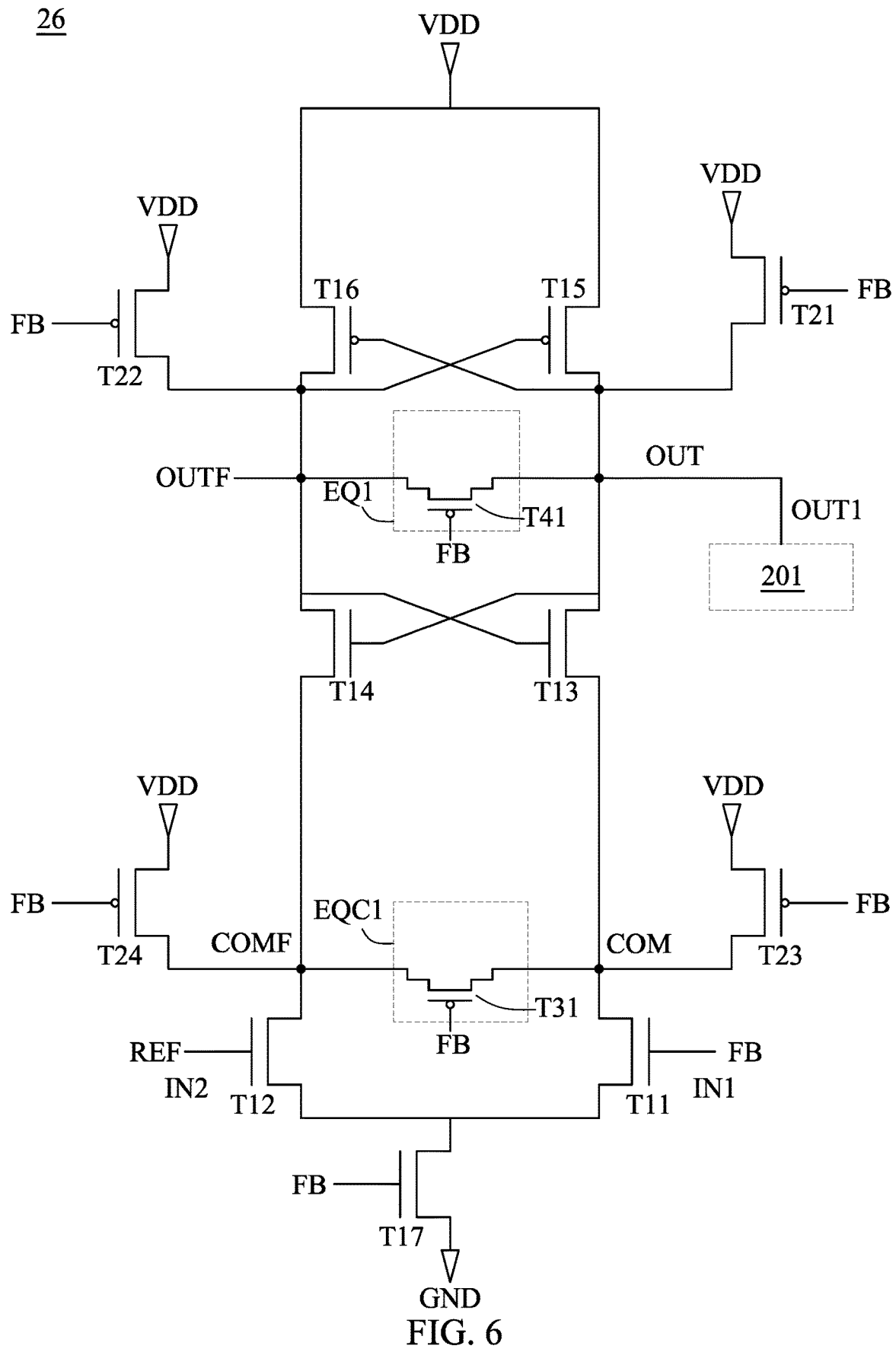
FIG. 6 is a schematic diagram of a phase detector in accordance with some embodiments of the present disclosure.

FIG. 6 is a schematic diagram of a phase detector 26 in accordance with some embodiments of the present disclosure. The characteristics of the elements with the same reference numerals as those in FIGS. 2 and 4 can be referred to the relevant descriptions of FIGS. 2 and 4. The phase detector 20 of the electronic device 100 of FIG. 1 may be replaced by the phase detector 26 of FIG. 6.

The phase detector 26 includes an equalizer device EQ1 connected between the first output terminal OUT and the second output terminal OUTF. The equalizer device EQ1 may include a p-type transistor T41. The p-type transistor T41 has a gate configured to receive the feedback signal FB, a drain electrically connected to the first output terminal OUT and a source electrically connected to the second output terminal OUTF. In some embodiments, the drain of the p-type transistor T41 may be electrically connected to the second output terminal OUTF and the source of the p-type transistor T41 may be electrically connected to the first output terminal OUT. The p-type transistor T41 may be a MOSFET.

Figure 7:
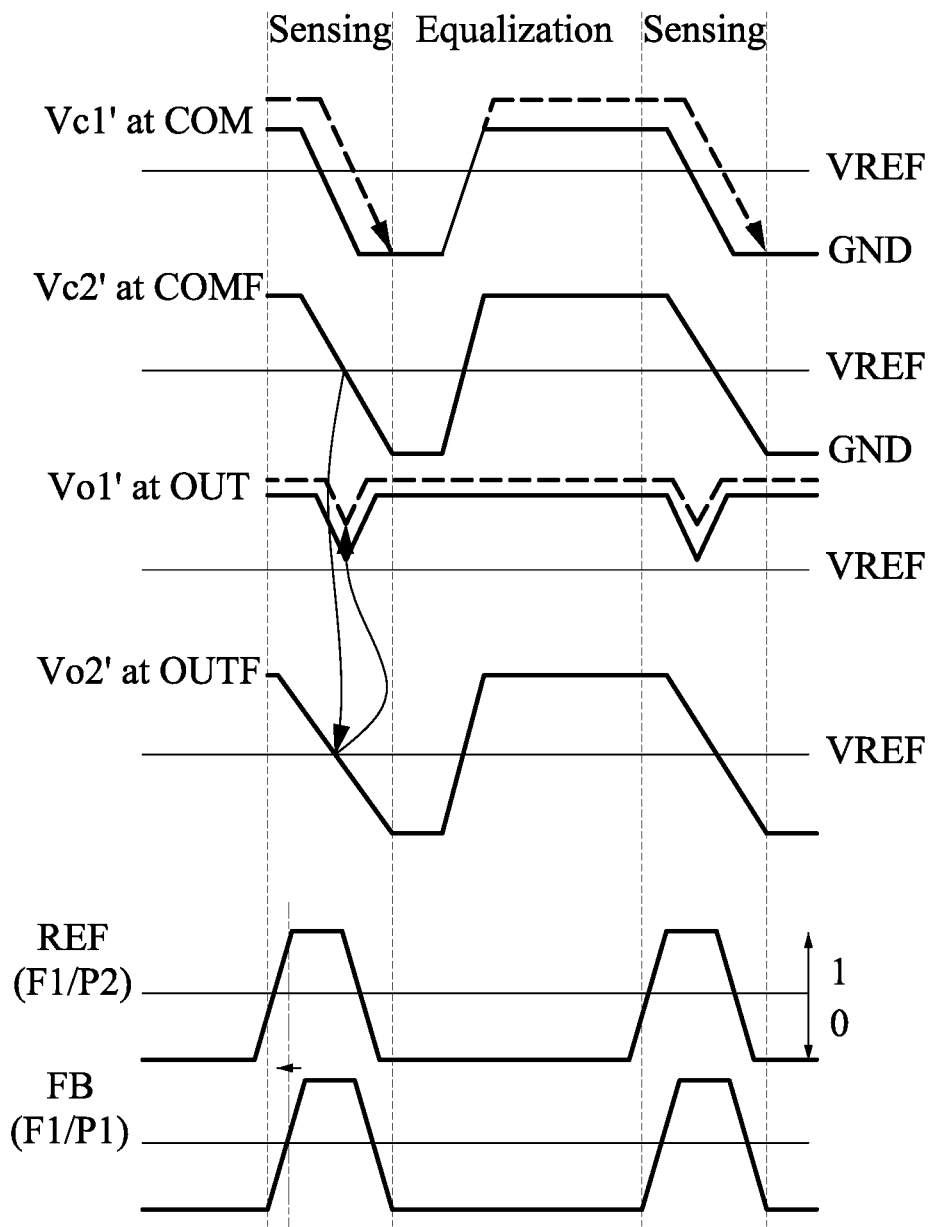
FIG. 7 is a timing diagram for operation of a phase detector in accordance with some embodiments of the present disclosure.

FIG. 7 is a timing diagram for operation of the phase detector 26 in accordance with some embodiments of the present disclosure.

During the equalization period, the equalizer device EQ1 may be configured to equalize a voltage Vo1' at the first output terminal OUT and a voltage Vo2' at the second output terminal OUTF during the equalization period. In some embodiments, the p-type transistor T41 of the equalizer device EQ1 is turned on since the feedback signal FB as received by the gate thereof is logic low value. The equalizer device EQ1 electrically connects the first output terminal OUT and the second output terminal OUTF. The voltage Vo1' at the first output terminal OUT and the voltage Vo2' at the second output terminal OUTF may be equalized, e.g., substantially the same. The solid line in the waveform of the voltage at the first output terminal OUT represent the voltage Vo1 and the dashed line in the waveform of the voltage Vo1' represents the equalized voltage. In some embodiments, the voltage Vo1' or the voltage Vo2' may be in a range between the voltage Vo1 and the voltage Vo2.

As shown in FIG. 7. The voltage Vo1' and the voltage Vo2' are at substantially the same at the beginning of the sensing period. The imbalance between the output terminals OUT and OUTF of the phase detector 20 or the phase detector 25 can be significantly alleviated. In other words, regardless of the difference between the loading at the first output terminal OUT and that at the second output terminal OUTF, the equalizer device EQ1 is capable of equalizing the voltages at the two output terminals OUT and OUTF. As such, the operation of the phase detector 26 during the sensing period can be correctly performed.

During the sensing period, in response to the feedback signal FB, the equalizer device EQ1 turns off to electrically disconnect the first output terminal OUT and the second output terminal OUTF.

At the beginning of the sensing period, the voltage Vo1' at the first output terminal OUT falls with the voltage Vc1' at the first comparison node COM. In the meantime, the voltage Vo2' at the second output terminal OUTF falls with the voltage Vc2' at the second comparison node COMF. When the voltage Vc2' at the second comparison node COW reaches the reference voltage value VREF, the transistor T14 turns on and the voltage Vo2' at the second output terminal OUTF follows the voltage Vc2' at the first comparison node COM. The voltage Vo2' at the second output terminal OUTF reaches the ground level (or is pulled down to the ground GND) through the transistors T12 and T14. Subsequently, the gate of the transistor (or the n-type transistor) T13 receives the voltage Vo2' with the ground level (or logic low value, "0") to turn off the transistor T13. The gate of the transistor (or the p-type transistor) T15 receives the voltage Vo2' with the ground level to turn on the transistor T15. As shown in FIG. 7, the voltage Vo1' at the first output terminal OUT is electrically connected to the supply voltage through the transistor T15 and reverts to the initial state at the beginning of the sensing period.

The phase detector 26 transmits the output signal OUT1 which represents the voltage Vo1' (logic high value, "1") at the first output terminal OUT to the delay line controller 201. In response to the output signal OUT1, the delay line controller 201 is configured to control the delay line 11 to decrease the delay of the phase of the clock signal CLK2 in FIG. 1, which is associated with the feedback signal FB. As a result, the phase detector 26 functions correctly and the difference between the phases of the feedback signal FB and the reference signal REF is reduced. During a plurality of cycles of the sensing period and the equalization period, the feedback signal FB and the reference signal REF may be synchronized or nearly synchronized.

FIG. 7 illustrates the operation of the phase detector 26 when the phase P1 of the feedback signal FB is later than the phase P2 of the reference signal REF. In some embodiments, the operation of the phase detector 26 when the phase P1 of the feedback signal FB is ahead of the phase P2 of the reference signal REF is similar to those as discussed previously. The difference is that the voltage at the second output terminal OUTF may be pulled up to the supply voltage; the voltage at the first output terminal OUT may be pulled down to the ground GND; and the phase detector 26 may transmit an output signal with the logic low value, "0," to the delay line controller 201. Subsequently, the delay line controller 201 may be configured to control the delay line 11 to increase the delay of the phase of the clock signal CLK2 in FIG. 1.

Figure 8:
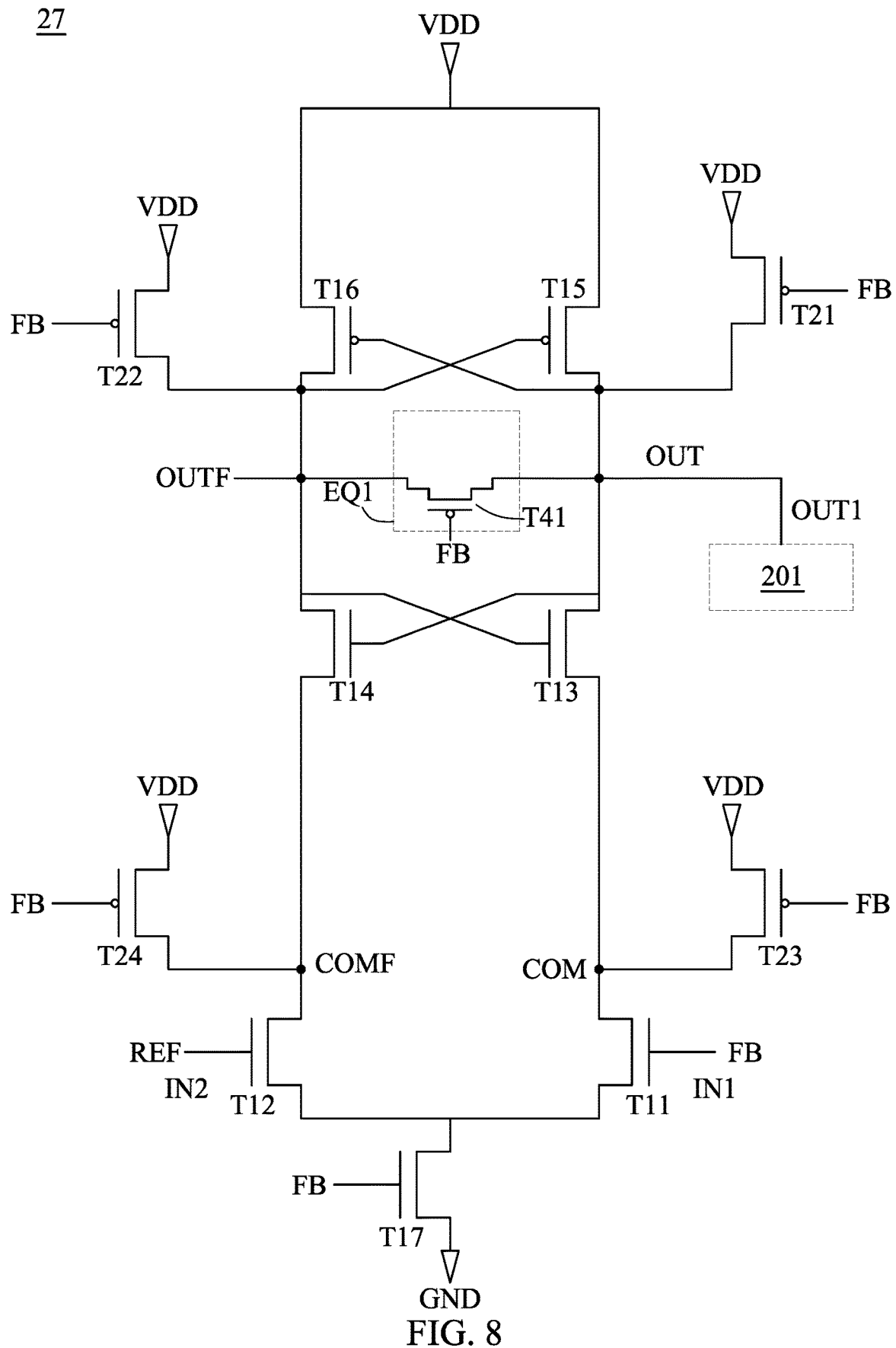
FIG. 8 is a schematic diagram of a phase detector in accordance with some embodiments of the present disclosure.

FIG. 8 is a schematic diagram of a phase detector 27 in accordance with some embodiments of the present disclosure. The characteristics of the elements with the same reference numerals as those in FIG. 6 can be referred to the relevant descriptions of FIG. 6. The phase detector 20 of the electronic device 100 of FIG. 1 may be replaced by the phase detector 27 of FIG. 8. The phase detector 27 does not include the equalizer device EQC1. Although there may be imbalance between the first comparison node COM and the second comparison node COMF, the equalization of the equalizer device EQ1 between the output terminals OUT and OUTF still assures correct operation of the phase detector 27.

Figure 9:
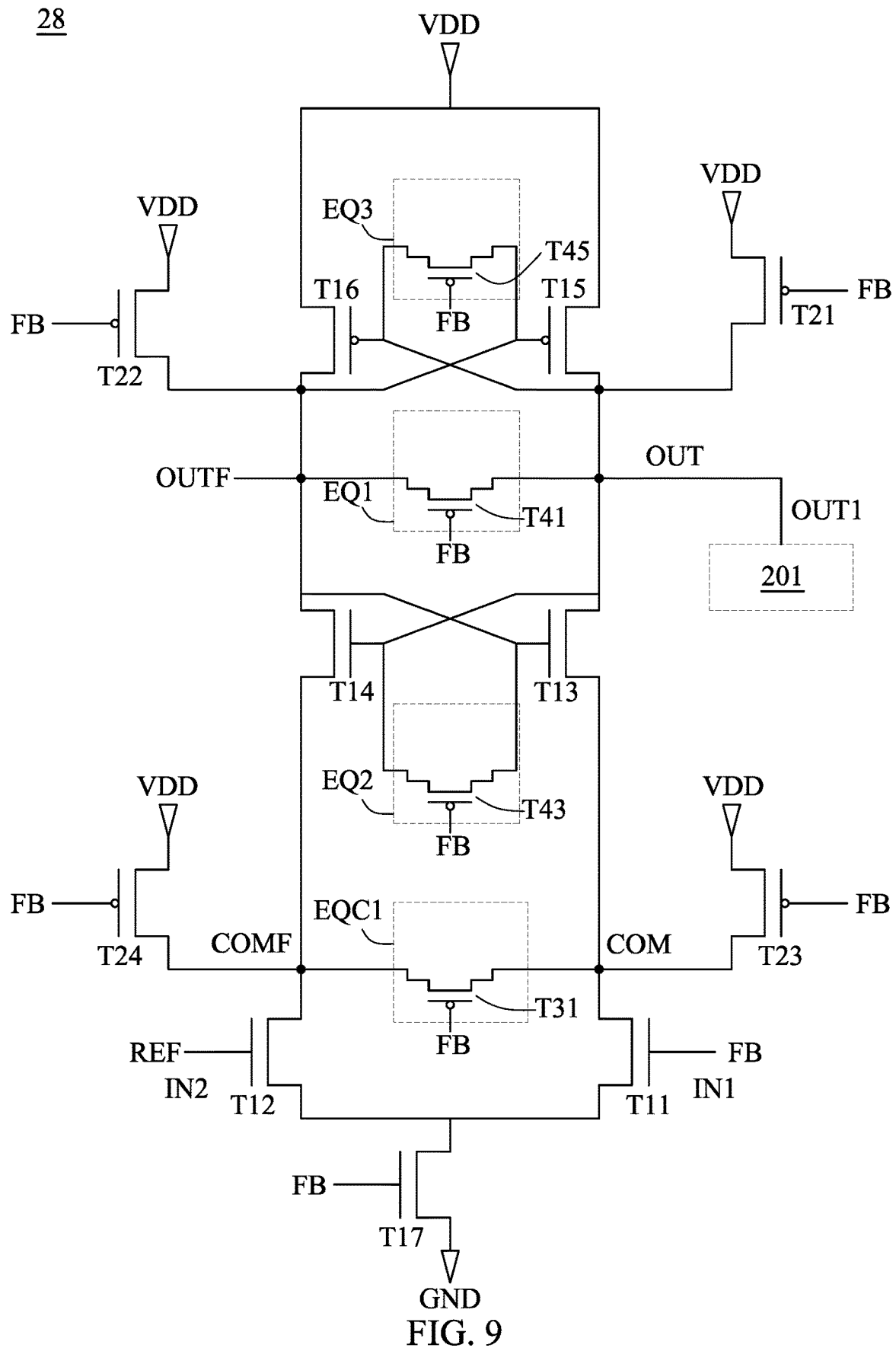
FIG. 9 is a schematic diagram of a phase detector in accordance with some embodiments of the present disclosure.

FIG. 9 is a schematic diagram of a phase detector 28 in accordance with some embodiments of the present disclosure. The characteristics of the elements with the same reference numerals as those in FIG. 6 can be referred to the relevant descriptions of FIG. 6. The phase detector 20 of the electronic device 100 of FIG. 1 may be replaced by the phase detector 28 of FIG. 9.

The phase detector 28 includes an equalizer device EQ2 connected between the gate of the transistor T13 and the gate of the transistor T14. The equalizer device EQ2 may include a p-type transistor T43. The p-type transistor T43 has a gate configured to receive the feedback signal FB, a drain electrically connected to the gate of the transistor T13, and a source electrically connected to the gate of the transistor T14. In some embodiments, the drain of the p-type transistor T43 may be electrically connected to the gate of the transistor T14 and the source of the p-type transistor T43 may be electrically connected to the gate of the transistor T13. The p-type transistor T43 may be a MOSFET.

During the equalization period, the equalizer device EQ2 may be configured to equalize a voltage at the gate of the transistor T13 and a voltage at the gate of the transistor T14 during the equalization period. The gate of the transistor T43 receives the feedback signal FB with the logic low value to turn on the transistor T43. The equalizer device EQ2 electrically connects the gate of the transistor T13 and the gate of the transistor T14. The voltage at the transistor T13 and the voltage at the transistor T14 may be equalized, e.g., substantially the same.

During the sensing period, in response to the feedback signal FB, the equalizer device EQ2 turns off to electrically disconnect the gate of transistor T13 and the gate of transistor T14.

The phase detector 28 further includes an equalizer device EQ3 connected between the gate of the transistor T15 and the gate of the transistor T16. The equalizer device EQ3 may include a p-type transistor T45. The p-type transistor T45 has a gate configured to receive the feedback signal FB, a drain electrically connected to the gate of the transistor T15 and a source electrically connected to the gate of the transistor T16. In some embodiments, the drain of the p-type transistor T45 may be electrically connected to the gate of the transistor T16 and the source of the p-type transistor T45 may be electrically connected to the gate of the transistor T15. The p-type transistor T45 may be a MOSFET.

During the equalization period, the equalizer device EQ3 may be configured to equalize a voltage at the gate of the transistor T15 and a voltage at the gate of the transistor T16. The gate of the transistor T45 receives the feedback signal FB with the logic low value to turn on the transistor T45. The equalizer device EQ3 electrically connects the gate of the transistor T15 and the gate of the transistor T16. The voltage at the transistor T15 and the voltage at the transistor T16 may be equalized, e.g., substantially the same.

During the sensing period, in response to the feedback signal FB, the equalizer device EQ3 turns off to electrically disconnect the gate of transistor T15 and the gate of transistor T16.

Figure 10:
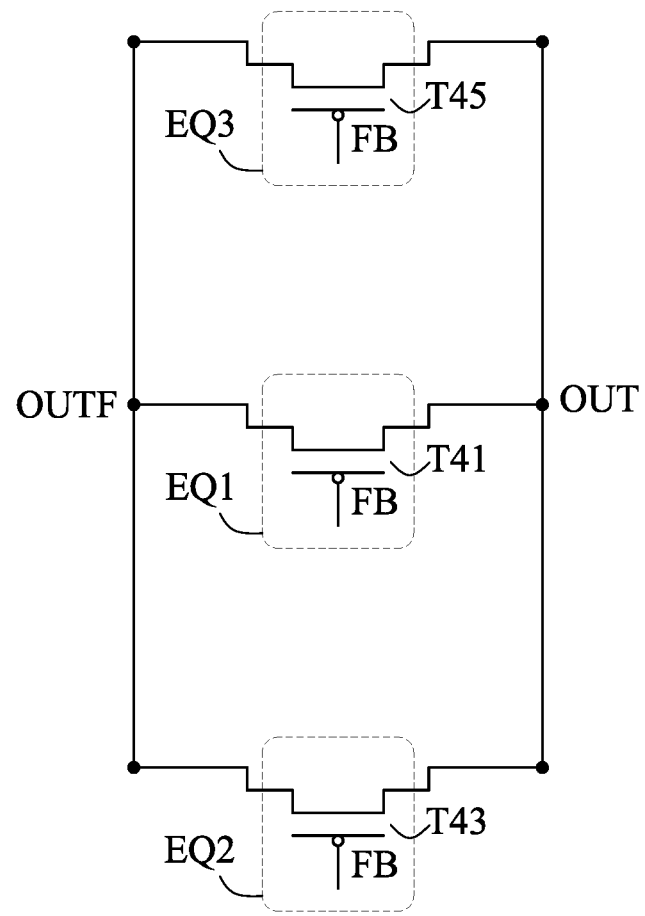
FIG. 10 is a schematic diagram of a portion of a phase detector in accordance with some embodiments of the present disclosure.

FIG. 10 is a schematic diagram of a portion of the phase detector 28 in accordance with some embodiments of the present disclosure. As shown in FIG. 10, from an electrical perspective, the equalizer device EQ1, the equalizer EQ2, and the equalizer EQ3 are electrically connected in parallel between the first output terminal OUT and the second output terminal OUTF.

Although FIG. 9 illustrates the schematic diagram of the phase detector 28, the different localities of the equalizer devices EQ1, EQ2, and EQ3 in the schematic diagram indicate that they are in different layout locations. Referring again to FIG. 9, the equalizer device EQ1 is located adjacent to the first output terminal OUT and the second output terminal OUTF. The equalizer device EQ2 is located adjacent to the gate of the transistor T13 and the gate of the transistor T14. The equalizer device EQ3 is located adjacent to the gate of the transistor T15 and the gate of the transistor T16. The localization of the equalizer devices EQ1, EQ2, and EQ3 enables the voltage equalization in a specific layout location, such that the impact of different loadings induced by local parasitic capacitors or resistors can be reduced.

Figure 11:
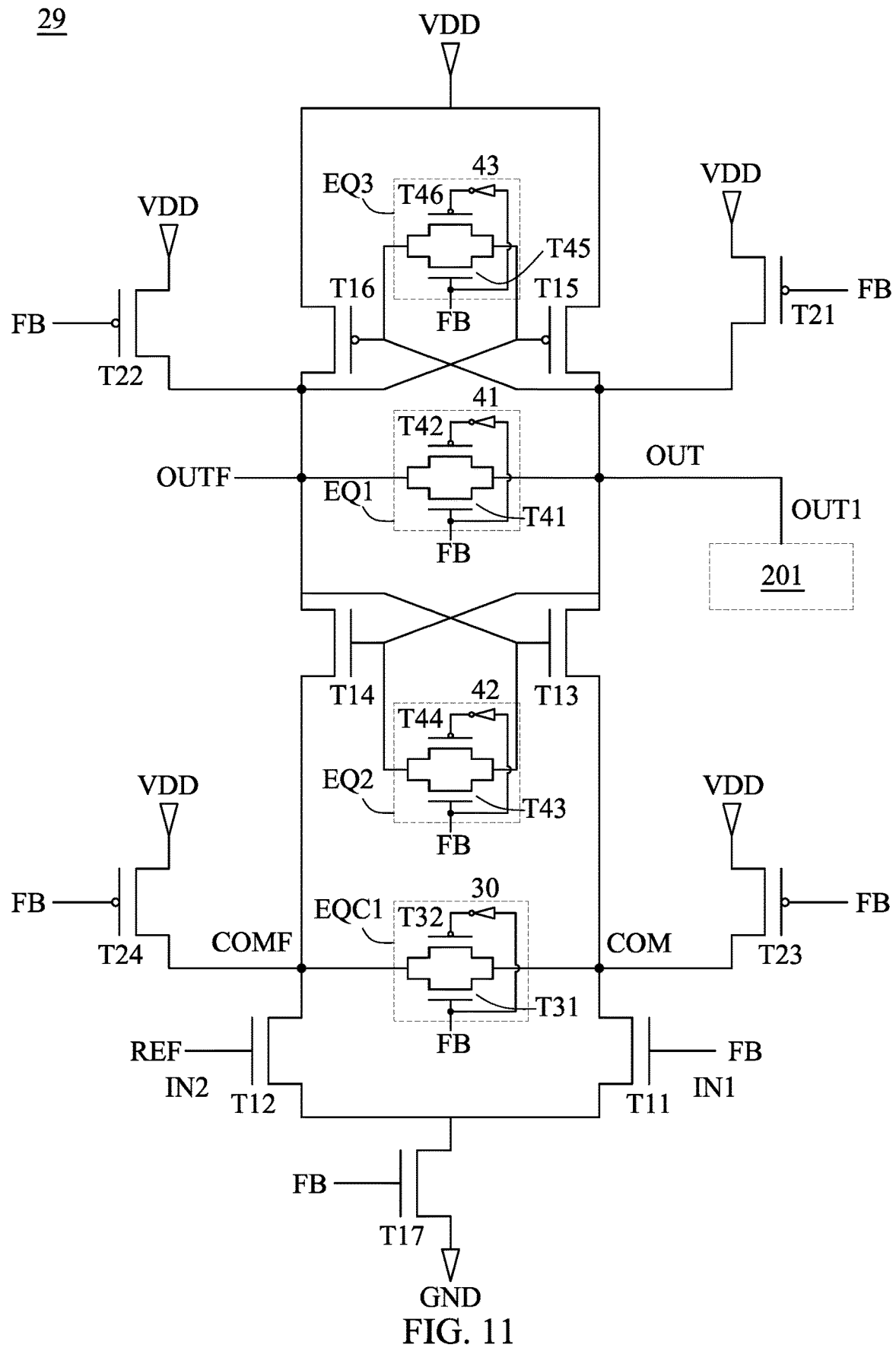
FIG. 11 is a schematic diagram of a phase detector in accordance with some embodiments of the present disclosure.

FIG. 11 is a schematic diagram of a phase detector 29 in accordance with some embodiments of the present disclosure. The characteristics of the elements with the same reference numerals as those in FIG. 11 can be referred to the relevant descriptions of FIG. 9. The phase detector 20 of the electronic device 100 of FIG. 1 may be replaced by the phase detector 29 of FIG. 11.

The equalizer device EQ1 of the phase detector 29 further includes an inverter 41 configured to invert the feedback signal FB, and a n-type transistor T42 and having a gate configured to receive the inverted feedback signal FB, a drain connected to a source of the p-type transistor T41, and a source connected to a drain of the p-type transistor T41. The equalizer device EQ1 includes the p-type transistor T41 and the n-type transistor T42 electrically connected in parallel.

In response to the inverted feedback signal FB from the inverter 41, the n-type transistor T42 is turned on during the equalization period and turned off during the sensing period. Thus, the p-type transistor T41 and the n-type transistor T42 are turned on to equalize voltages at the output terminals OUT and OUTF during the equalization period. The pair of the p-type transistor T41 and the n-type transistor T42 has a higher conductive current (or a wider channel) than, for example, the single p-type transistor T41 of the phase detector 28. As such, the time for discharging or charging the local capacitors can be relatively short and the equalization thus faster.

The equalizer device EQ2 of the phase detector 29 further includes an inverter 42 configured to invert the feedback signal FB, and a n-type transistor T44 and having a gate configured to receive the inverted feedback signal FB, a drain connected to a source of the p-type transistor T43, and a source connected to a drain of the p-type transistor T43. The equalizer device EQ2 includes the p-type transistor T43 and the n-type transistor T44 electrically connected in parallel.

In response to the inverted feedback signal FB from the inverter 42, the n-type transistor T44 is turned on during the equalization period and turned off during the sensing period. Thus, the p-type transistor T43 and the n-type transistor T44 are turned on to equalize voltages at the gate of the transistors T13 and T14 during the equalization period. The pair of the p-type transistor T43 and the n-type transistor T44 has a higher conductive current (or a wider channel) than, for example, the single p-type transistor T43. As such, the time for discharging or charging the local capacitors can be relatively short and equalization thus faster.

The equalizer device EQ3 of the phase detector 29 further includes an inverter 43 configured to invert the feedback signal FB, and a n-type transistor T46 and having a gate configured to receive the inverted feedback signal FB, a drain connected to a source of the p-type transistor T45, and a source connected to a drain of the p-type transistor T45. The equalizer device EQ3 includes the p-type transistor T45 and the n-type transistor T46 electrically connected in parallel.

In response to the inverted feedback signal FB from the inverter 43, the n-type transistor T46 is turned on during the equalization period and turned off during the sensing period. Thus, the p-type transistor T45 and the n-type transistor T46 are turned on to equalize voltages at the gate of the transistors T15 and T16 during the equalization period. The pair of the p-type transistor T45 and the n-type transistor T46 has a higher conductive current (or a wider channel) than, for example, the single p-type transistor T45. As such, the time for discharging or charging the local capacitors can be relatively short and equalization thus faster.

Figure 12:
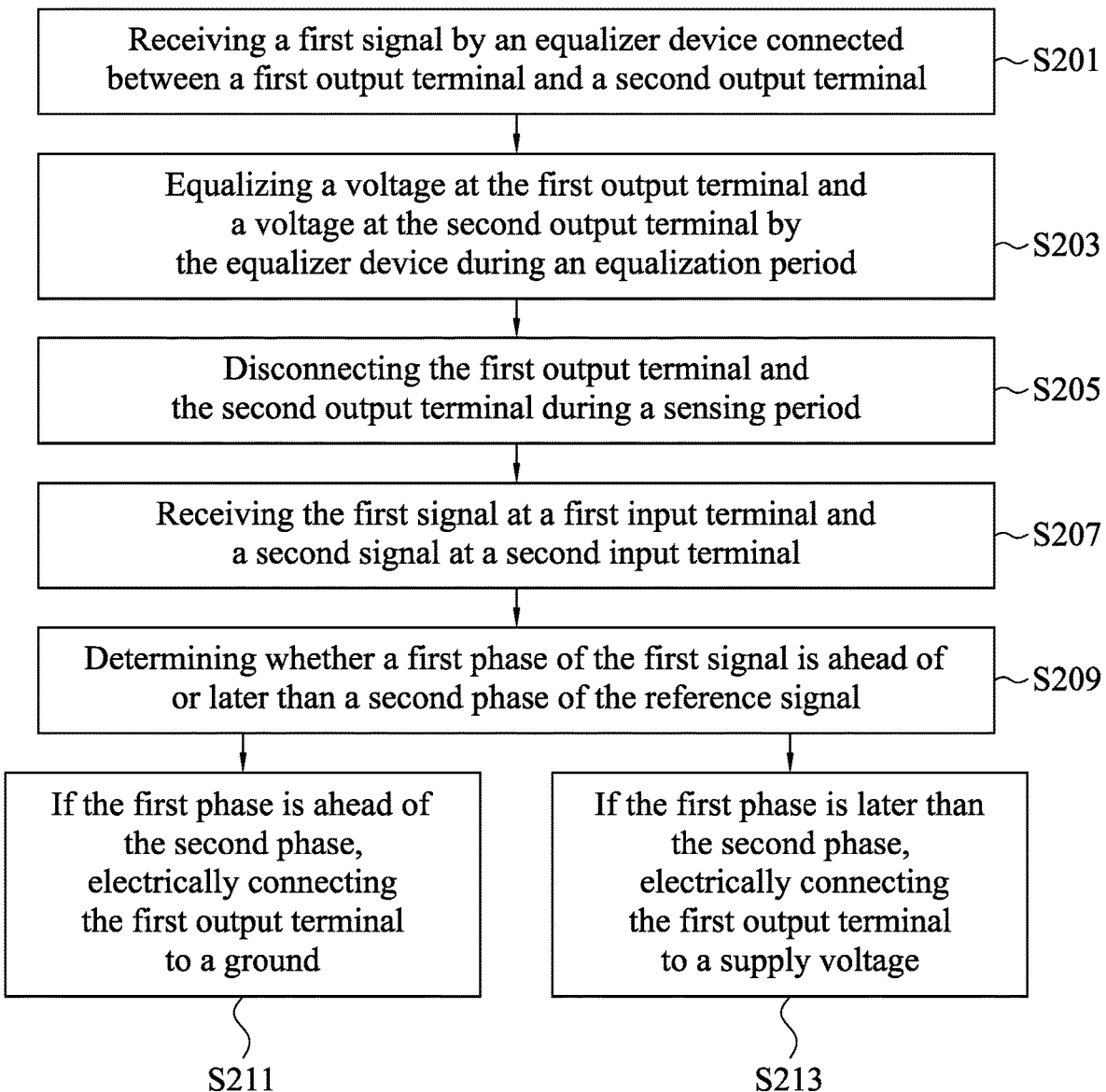
FIG. 12 is a flowchart of a method of controlling a phase detector, in accordance with some embodiments of the present disclosure.

FIG. 12 is a flowchart of a method 200 of controlling a phase detector (e.g. the phase detector 26, 27, 28, or 29) in accordance with some embodiments of the present disclosure.

The method 200 begins with operation S201 comprising receiving a first signal (e.g., the feedback signal FB) by an equalizer device (e.g., the equalizer device EQ1) connected between a first output terminal (e.g., the first output terminal OUT) and a second output terminal (e.g. the second output terminal OUTF).

The method 200 continues with operation S203 comprising equalizing a voltage at the first output terminal and a voltage at the second output terminal by the equalizer device during an equalization period.

The method 200 continues with operation S205 comprising disconnecting the first output terminal and the second output terminal during a sensing period.

The method 200 continues with operation S207 comprising receiving the first signal at a first input terminal (e.g., the first input terminal IN1) and a second signal (e.g., the reference signal REF) at a second input terminal (e.g., the second input terminal IN2).

The method 200 continues with operation S209 comprising determining whether a first phase (e.g., the phase P1) of the first signal is ahead of or later than a second phase (e.g., the phase P2) of the reference signal. The determination further includes comparing the first phase of the first signal and the second phase of the reference signal and calculating the difference therebetween. Based on the determination of operation S209, the method continues with operation S211 or operation S212.

Operation S211 comprises, if the first phase is ahead of the second phase, electrically connecting the first output terminal to a ground.

Operation S213 comprises, if the first phase is later than the second phase, electrically connecting the first output terminal to a supply voltage.

The method 200 may further comprise transmitting an output signal (e.g., the output signal OUT1) representing the voltage at the first output terminal to the next stage (e.g., the delay line controller 201).

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 12. In some embodiments, the method 200 can include one or more operations depicted in FIG. 12.

One aspect of the present disclosure provides a phase detector including a first transistor, a second transistor, a third transistor, a fourth transistor, and a first equalizer device. The first transistor has a first input terminal configured to receive a first signal. The second transistor has a second input terminal configured to receive a second signal. The third transistor is electrically connected to the first transistor and has a first output terminal. The fourth transistor is electrically connected to the second transistor and has a second output terminal. The first equalizer device is connected between the first output terminal and the second input terminal.

Another aspect of the present disclosure provides a phase detector including a first output terminal, a second output terminal, a first p-type transistor, a second p-type transistor, a first equalizer device, and a second equalizer device. An output signal at the second output terminal is complementary to that of the first output terminal. The first p-type transistor has a gate electrically connected to the second output terminal, source electrically connected to a supply voltage, and a drain electrically connected to the first output terminal. The second p-type transistor has a gate electrically connected to the first output terminal, a source electrically connected to the supply voltage, and a drain electrically connected to the second output terminal. The first equalizer device is connected between the first output terminal and the second input terminal. The second equalizer device is connected between the gate of the first p-type transistor and the gate of the second p-type transistor.

Another aspect of the present disclosure provides an electronic device including a receiver, delay line, a data output port, and phase detector. The receiver is configured to receive a reference clock signal and generate a first signal. The delay line is electrically connected to the receiver and configured to adjust a phase of the first signal to generate a second signal. The data output port is electrically connected to the delay line and provides a feedback signal associated with the second signal. The phase detector is electrically connected to the data output port and the delay line. The phase detector includes a first transistor, a second transistor, a third transistor, a fourth transistor, and a first equalizer device. The first transistor has a first input terminal configured to receive a first signal. The second transistor has a second input terminal configured to receive a second signal. The third transistor is electrically connected to the first transistor and has a first output terminal. The fourth transistor is electrically connected to the second transistor and has a second output terminal. The first equalizer device is connected between the first output terminal and the second input terminal.

The phase detector of the present disclosure includes a first transistor having a first input terminal configured to receive a first signal, a second transistor having a second input terminal configured to receive a second signal, a third transistor electrically connected to the first transistor and having a first output terminal, and a fourth transistor electrically connected to the second transistor and having a second output terminal. The phase detector further includes a first equalizer device connected between the first output terminal and the second input terminal. The first equalizer device is configured to turn on to equalize voltages at the first output terminal and the second output terminal during an equalization period. The voltages at the first and second output terminals are equalized before the phase detector is operated during a sensing period. As such, the imbalance between the first and second output terminals can be alleviated. Furthermore, the phase detector may include a plurality of equalizer devices electrically connected in parallel but in different layout locations. One of the equalizer devices (e.g., the first equalizer device) is located adjacent to the first output terminal and the second output terminal. Another of the equalizers may be located adjacent to a gate of the third transistor and a gate of the fourth transistor. Yet another of the equalizer devices may be adjacent to a gate of a first pull-up transistor and a gate of a second pull-up transistor. The localization of the equalizer devices enables the equalization in a specific layout location, such that the impact of different loadings induced by local parasitic capacitors or resistors can be reduced. The equalizer devices may include an n-type transistor and a p-type transistor electrically connected in parallel. During the equalization period, the n-type transistor and p-type transistor are turned on to equalize voltages at different two nodes. The pair of the p-type transistor and the n-type transistor has a higher conductive current than, for example, a single p-type transistor. As such, the time for discharging or charging the local capacitors can be relatively short and equalization thus faster.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A phase detector, comprising:
   a first transistor having a first input terminal configured to receive a first signal;
   a second transistor having a second input terminal configured to receive a second signal;
   a third transistor electrically connected to the first transistor and having a first output terminal;
   a fourth transistor electrically connected to the second transistor and having a second output terminal; and
   a first equalizer device connected between the first output terminal and the second input terminal;
   wherein the first equalizer is configured to:
   (i) during an equalization period, be turned on to equalize voltages at the first output terminal and the second output terminal; and
   (ii) during a sensing period, be turned off to electrically disconnect the first output terminal and the second output terminal wherein the first signal and the second signal have a same frequency, and wherein the first signal has a first phase and the second signal has a second phase;

wherein, during the sensing period, if the first phase of the first signal is later than the second phase of the second signal, the second transistor and the fourth transistor pull down a voltage at the second output terminal to a ground.

2. The phase detector of claim 1, wherein, during the sensing period, if the first phase of the first signal is ahead of the second phase of the second signal, the first transistor and the third transistor pull down a voltage at the first output terminal to the ground.

3. The phase detector of claim 1, wherein the first transistor has a gate as the first input terminal, a source electrically connected to a ground, and a drain electrically connected to a source of the third transistor.

4. The phase detector of claim 3, wherein the second transistor has a gate as the second input terminal, a source electrically connected to the ground, and a drain electrically connected to a source of the fourth transistor.

5. The phase detector of claim 1, wherein the third transistor has a gate electrically connected to the second output terminal, a source electrically connected to a source of the first transistor, and a drain as the first output terminal.

6. The phase detector of claim 5, wherein the fourth transistor has a gate electrically connected to the first output terminal, a source electrically connected to a source of the first transistor, and a drain as the second output terminal.

7. The phase detector of claim 6, further comprising a second equalizer device connected between the gate of the third transistor and the gate of the fourth transistor.

8. The phase detector of claim 7, wherein the first equalizer device and the second equalizer device are electrically connected in parallel but are in different layout locations.

9. The phase detector of claim 1, further comprising a fourth equalizer device connected between a drain of the first transistor and a drain of the second transistor.

10. A phase detector, comprising:
a first transistor having a first input terminal configured to receive a first signal;
a second transistor having a second input terminal configured to receive a second signal;
a third transistor electrically connected to the first transistor and having a first output terminal;
a fourth transistor electrically connected to the second transistor and having a second output terminal; and
a first equalizer device connected between the first output terminal and the second input terminal;

wherein the first equalizer is configured to:
(i) during an equalization period, be turned on to equalize voltages at the first output terminal and the second output terminal; and
(ii) during a sensing period, be turned off to electrically disconnect the first output terminal and the second output terminal;

wherein the first equalizer includes a first p-type transistor having a gate configured to receive the first signal, a drain connected to a drain of the first transistor, and a source connected to a drain of the second transistor;

wherein, in response to the first signal, the first p-type transistor is turned on during the equalization period and turned off during the sensing period;

wherein the first equalizer includes an inverter configured to invert the first signal, and a first n-type transistor and having a gate configured to receive the inverted first signal, a drain connected to a source of the first p-type transistor, and a source connected to a drain of the first p-type transistor.

11. The phase detector of claim 10, wherein, in response to the inverted first signal, the first n-type transistor is turned on during the equalization period and turned off during the sensing period.

12. A phase detector, comprising:
a first transistor having a first input terminal configured to receive a first signal;
a second transistor having a second input terminal configured to receive a second signal;
a third transistor electrically connected to the first transistor and having a first output terminal;
a fourth transistor electrically connected to the second transistor and having a second output terminal;
a first equalizer device connected between the first output terminal and the second input terminal;
a fifth transistor having a gate electrically connected to the second output terminal, a source electrically connected to a supply voltage, and a drain electrically connected to the first output terminal;
a sixth transistor having a gate electrically connected to the first output terminal, a source electrically connected to the supply voltage, and a drain electrically connected to the second output terminal; and
a third equalizer device connected between the gate of the fifth transistor and the gate of the sixth transistor.

13. The phase detector of claim 12, wherein the first equalizer device and the third equalizer device are electrically connected in parallel but are in different layout locations.

* * * * *